United States Patent [19]

Hendrickson

[11] 4,236,831

[45] Dec. 2, 1980

[54] SEMICONDUCTOR APPARATUS

[75] Inventor: Thomas E. Hendrickson, Wazata, Minn.

[73] Assignee: Honeywell Inc., Minneapolis, Minn.

[21] Appl. No.: 61,215

[22] Filed: Jul. 27, 1979

[51] Int. Cl.³ .............................................. H01L 27/14
[52] U.S. Cl. ........................................ 357/30; 357/23; 357/41; 357/55; 357/59; 357/76
[58] Field of Search ...................... 357/23, 30, 41, 55, 357/59, 76

[56] References Cited

U.S. PATENT DOCUMENTS

| 3,617,825 | 11/1971 | Chilton et al. | 357/30 |
| 3,653,971 | 4/1972 | Lidorenko et al. | 357/30 |
| 3,725,751 | 4/1973 | Wakamiya | 357/30 |
| 3,936,319 | 2/1976 | Anthony et al. | 357/30 |
| 4,025,943 | 5/1977 | Chamberlain et al. | 357/30 |
| 4,051,374 | 9/1977 | Drexhage et al. | 357/30 |
| 4,081,820 | 3/1978 | Chitre | 357/30 |

Primary Examiner—Edward J. Wojciechowicz
Attorney, Agent, or Firm—Theodore F. Neils

[57] ABSTRACT

A semiconductor device is provided having a plurality of photodiodes formed in series by polycrystalline semiconductor material.

14 Claims, 3 Drawing Figures

SEMICONDUCTOR APPARATUS

REFERENCE TO COPENDING APPLICATION

Reference is hereby made to the earlier filed copending application by T. E. Hendrickson and R. G. Koelsch entitled "Semiconductor Apparatus" having Ser. No. 24,840 which discloses semiconductor devices related to the present application, this copending application being assigned to the same assignee as the present application.

BACKGROUND OF THE INVENTION

The present invention is related to semiconductor device structures which can receive signals via electromagnetic radiation for the purposes of electrical signal control and switching in such semiconductor device structure, and more particularly, to the electromagnetic radiation receiving means in such structures.

The field-effect transistor has certain attributes which are attractive for analog signal switching. The first of these is that a field-effect transistor can be a bilateral device so that, for alternating polarity waveform switching, the field-effect transistor appears to have the same output characteristics whatever the waveform polarities are at which the designated source and drain regions in the device happen to be operated at during any point in a waveform cycle. Further, there is no offset voltage in the source-drain volt-ampere characteristic of a common source operated field-effect transistor as there is in the collector volt-ampere characteristic of a common emitter operated bipolar transistor.

While field-effect transistor devices can have problems concerning the resistance occurring between the effective drain and source when in the "on" condition, and in having sufficient capability to withstand substantial voltages when in the "off" condition, field-effect device structures have been found which are capable of overcoming these problems. Some of these devices are described in the above-reference copending application. These devices include the metal-oxide-semiconductor field-effect transistor (MOSFET) device in various configurations.

Electronic component device theory shows that field-effect transistors are operated by controlling the voltage appearing between the gate thereof and the connection to that one of the two channel regions therein which is effectively serving as the transistor source, or the connection to the substrate. Difficulties arise in those circuits using a field-effect transistor to control power transfers from an alternating polarity power supply because the connections to the channel region of such a transistor serve alternately as the source connections rather than one of them serving continually as the source connection.

A number of electronic circuits have been found for use in controlling the operation of field-effect transistors used as the primary element to control power transfers from an alternating polarity power supply to a load means. However, many of these circuits are inconvenient or expensive to implement or require connections to be made to the gate or substrate of the primary control element field-effect transistor device which negate complete electrical isolation between segments of the control circuitry and the primary power control field-effect transistor device.

SUMMARY OF THE INVENTION

A semiconductor device is provided comprising a layer of polycrystalline semiconductor material formed on the surface of an electrical insulation means in a semiconductor device. The polycrystalline semiconductor material layer has a configuration of alternating conductivity type regions, with electrical shorting means occurring between some of the adjacent regions, to provide photodiodes in a series electrical connection. The voltage developed by each of the photodiodes in response to electromagnetic radiation impinging thereon is thereby added to that of each of the other series diodes to provide a substantial accumulated voltage over the sequence of photodiodes taken together.

The photodiodes in series may be connected between the gate of a field-effect transistor, or other field-effect device, and the substrate thereof or other region therein, or between such a gate and control terminals of other kinds of electronic devices, to provide control signals to those gates or terminals corresponding to electromagnetic radiation based signals received by the photodiodes.

DESCRIPTION OF THE PREFERRED EMBODIMENT

An effective means has been found for permitting control of a first circuit by actions occurring in a second circuit that is electrically isolated from the first circuit, that is, by use of a photodetector in the first circuit and the light emitting device in the second circuit which is coupled electromagnetically, but not electrically, to the photodetector of the first circuit. In such an arrangement, there need be no electrical connection whatsoever between the first circuit being controlled, including the photodetector, and the second circuit doing the controlling via a light emitting device. However, most often the photo detector device is either a photodiode formed in the monolithic integrated circuit or formed as a discreet device and electrically connected to the remaining part of the first circuit to be controlled.

The approach of using a photodiode formed in the substrate of a monolithic integrated circuit has a drawback in that it is difficult or impossible to form such photodiodes in an electrical series connection to increase the output voltage they provide in response to control signals received based on electromagnetic radiation emanated from the light emitting device. Quite often, a much larger control voltage is required than is available at the output of a single photodiode in order to operate the circuit to be controlled. The simplest way to increase this control voltage is to provide a series of these photodiodes, all subject to being impinged upon by the same electromagnetic radiation transmission such that the individual photodiode output voltage from each member in a series interconnection adds directly to that of every other member in the series to provide a cumulative output voltage for directing operation of the remaining portion of the circuit being controlled. The difficulty in forming a series of such photodiodes in a signal substrate occurs because the substrate, in a typical monolithic integrated circuit construction, serves as either the anode or the cathode of the photodiode for every such diode formed.

While a number of series connected photodiodes each formed as a discreet semiconductor circuit component can be connected in series, such an arrangement takes a substantial amount of expensive labor to manufacture and a relatively large volume. These are significant drawbacks where a large volume of cheap control circuits are desired for application in a wide variety of uses.

Figure 1:
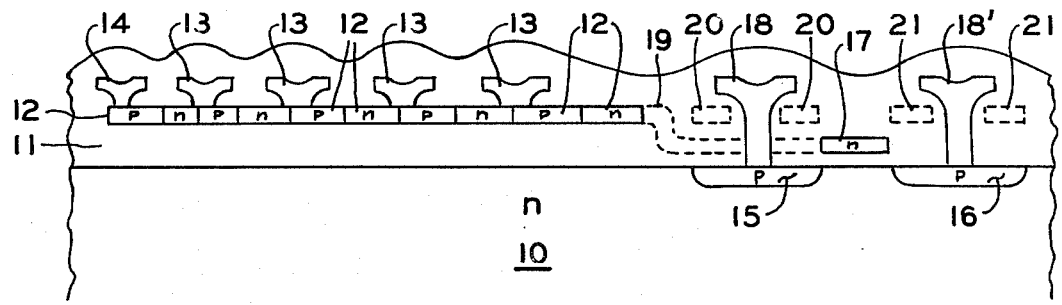
FIG. 1 shows a cross section of a semiconductor device having a version of the present invention.

FIG. 1 in the present application shows an alternative manner of fabricating the desired photodiodes in a monolithic integrated circuit. There, a series of polycrystalline silicon photodiodes are fabricated on an electrically insulating base which is provided over the semiconductor material substrate of the monolithic integrated circuit device. The photodiodes are completely lateral and the insulating base forms no part of the electromagnetic sensing or electrical conduction portions of the photodiode devices. Thus, these polycrystalline silicon, or "polysilicon", photodiodes can be connected in series.

Polycrystalline silicon photodiodes do not develop a very large output voltage in each individual diode in response to electromagnetic radiation impinging thereon, as each such photodiode is a relatively inferior transduction device. However, since the polycrystalline silicon photodiodes are formed on a dielectric layer rather than in a semiconductor substrate, and so can be connected in series, a rather large number of such devices can be provided in series to give a sufficient output voltage. This is because the polycrystalline silicon photodiodes can be spread over a relatively wide extent on the dielectric layer. The formation of other circuit components in the monolithic integrated circuit will occur in or near the semiconductor substrate and so will not interfere with the polycrystalline silicon photodiodes lying above. Furthermore, the series string of polycrystalline silicon photodiodes can be relatively easily connected, at least at one end to another circuit point in the monolithic integrated circuit. This can be accomplished by using polycrystalline silicon, formed on the insulating base at the same time as is the polycrystalline silicon for the photodiodes, as an interconnection means to the other circuit point.

In more detail, FIG. 1 shows a silicon substrate, 10, which has been doped with phosphorus to have an n-type conductivity. Typically, the resistivity of substrate 10 will be between 4 to 12 ohm-cm. The silicon is typically Czochralski grown and has a major surface, which is a (100) plane, through and on which any fabrication processes resulting in circuit components located in the substrate will take place. These characteristics of the silicon substrate are more or less unimportant as far as the polysilicon photodiodes are concerned as they are not formed on or in this substrate, but play a role in the performance of other electrical circuit components formed in the monolithic integrated circuit in other portions than that portion shown in FIG. 1 under the photodiodes. These characteristics of the substrate will, for instance, be important for the metal-oxide-semiconductor field-effect device shown in the right-hand portion of FIG. 1, particularly if it is to be a device of the type described in the patent application referenced above. The structure shown for the device of FIG. 1 of the present application is not fully represented as such a device from the referenced application above, but rather has the structure of an ordinary metal-oxide-semiconductor field-effect transistor (MOSFET) which it can very well be. However, this structure may also be viewed as an abbreviated representation for the devices described in the above-referenced application.

Provided on substrate 10 is a dielectric insulating layer, 11. While dielectric insulating layer 11 is shown as 1 continuous structure on a major surface of substrate 10 and surrounding other structures in whole or part, insulating layer 11 is usually a composite structure built up from several dielectric layers not all of which need be the same material. Typically, however, insulating layer 11 will be constructed from layers of silicon dioxide and, possibly, silicon nitride.

Formed on one of these layers of silicon dioxide, as shown in FIG. 1, is a layer of polycrystalline silicon, 12. Polycrystalline silicon layer 12, or "polysilicon" layer 12, may be typically provided over the silicon dioxide as a widespread layer of undoped polysilicon. This undoped polysilicon is then defined into a layer of a desired shape on the silicon dioxide, typically a strip, using standard masking procedures. Thereafter, the polysilicon can be doped by implanting it with boron to form a p-type conductivity polycrystalline silicon strip. Finally, using standard masking procedures, alternate portions of the strip can be implanted with phosphorus, thus forming n-type conductivity portions which alternate along the strip with the remaining p-type conductivity portions.

Photodiodes in polycrystalline silicon strip 12 are formed by pairs of p- and n-type conductivity regions, the members of the pair being immediately adjacent such p- and n-type conductivity regions in strip 12 separated by a seniconductor pn junction. A string of such diodes, electrically connected in series, can be formed by thereafter providing metallic shorting bars, 13, in ohmic contact with a p-type conductivity region member from one pair and an n-type conductivity region member from an immediately adjacent pair. Such a shorting bar produces an electrical short circuit around the semiconductor pn junction occurring between such pairs, i.e., photodiodes.

At the same time that metallic shorting bars 13 are provided, interconnection metallization can be provided for the remainder of the monolithic integrated circuit chip, including the MOSFET shown in FIG. 1, as well as for the series string of photodiodes. Thus, interconnection metallization terminal, 14, is shown in ohmic contact with one end member region of polycrystalline silicon strip 12, a p-type conductivity region member of the most leftward photodiode pair of regions in strip 12. Another terminal could also have been shown connected to the opposite end member of this strip.

However, an alternative arrangement for connecting the string of photodiodes to the field-effect device shown on the right hand side of FIG. 1 is shown where this device has a polycrystalline silicon gate. The basic MOSFET structure shown has channel terminating regions 15 and 16, either of which may be the source or drain region for the device at some point in time, depending on the polarity of applied voltage, while the other region serves the opposite function. Regions 15 and 16 are of p-type conductivity. A gate region, 17, is shown and for present purposes is of doped polycrystalline silicon. The metallic interconnection means, 18 and 18', for regions 15 and 16 would simultaneously fabricated typically be of aluminum as would simultaneously fabricated shorting bars 13 and interconnection means terminal 14.

Shown in FIG. 1, is a dashed line interconnection structure, 19, extending between the right hand end member region of the alternating p-type and n-type conductivity regions forming polycrystalline silicon strip 12, on the one hand, and gate region 17 on the other. Interconnection structure 19 is also formed of doped polycrystalline silicon. In the usual situation, the polycrystalline silicon for strip 12, the polycrystalline silicon for interconnection silicon 19, and the polycrystalline silicon for gate region 17 will all be deposited at one time and the ion implantation step leading to the doping of portions of polycrystalline strip 12 to be of n-type conductivity will be done simultaneously with the doping of interconnection structure 19 and gate region 17 thereby leading to these regions being also of n-type conductivity.

Also shown in FIG. 1 are a pair of shield regions, 20 and 21, used for increasing the ability of the field-effect device to withstand voltage applied between regions 15 and 16 when this device is in the "off" condition as described in the application referenced above. Since shield electrodes 20 and 21 are typically also provided of doped polycrystalline silicon, the interconnection 19 might alternatively have been extended from polycrystalline silicon strip 12, containing the photodiode string, to shield regions 20 and 21 as opposed to being extended to gate region 17 should this have been a desirable electrical connection in using semiconductor device of FIG. 1 in its planned operational mode in FIG. 1.

Figure 2:
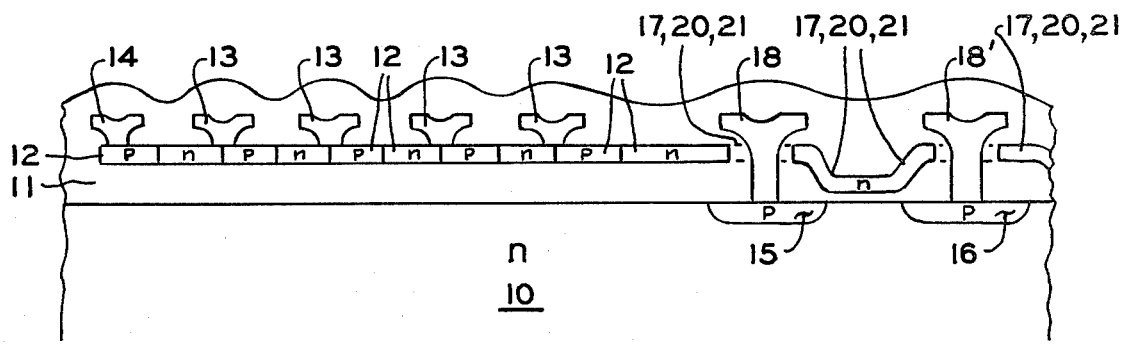
FIG. 2 shows a cross section of a semiconductor device having an alternative version of the present invention.

FIG. 2 shows an alternative situation where shield electrodes 20 and 21 of FIG. 1 and gate region 17 of FIG. 1 area all intended to be interconnected in the desired operational use planned for the FIG. 1 integrated circuit device. In this arrangement, one end of the string of photodiodes formed by the alternating p-type and n-type conductivity regions in polycrystalline silicon strip 12 are directly electrically connected to both the shield electrodes and the gate region of the field-effect device by a doped polycrystalline silicon structure extending from strip 12 to include gate region 17 and shield regions 20 and 21. The dashed lines shown in FIG. 2 indicate the remaining portions of the shield electrode device occurring behind the metallic interconnections 18 and 18' to complete the doped polycrystalline silicon interconnections. The combining of the gate region and the shield electrodes in this extended structure is shown by designating all these members with the designation 17, 20, 21. Details of such an arrangement in a field-effect device are described in the above referenced application.

Figure 3:
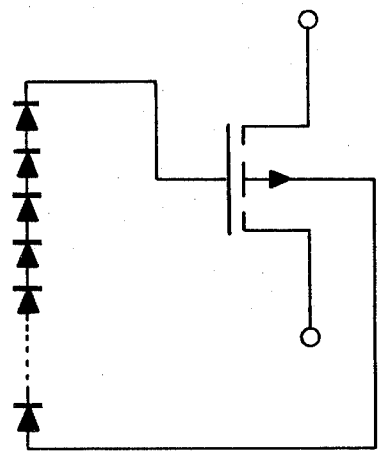
FIG. 3 shows a circuit schematic indicating a manner in which the present invention may be electrically interconnected.

FIG. 3 is a circuit schematic diagram showing a possible electrical interconnection for the string of diodes in polycrystalline silicon strip 12 to be used to permit these diodes to be capable of switching "on" the field-effect device shown on the right hand side of FIG. 1. That is, an electrical connection is shown made in FIG. 3 from terminal 14 in FIG. 1 to substrate 10 in FIG. 1 to permit radiation impinging on the string of photodiodes, from a light emitting device in some control circuit, to lead to sufficient voltage occurring across the string of photodiodes to switch "on" the field-effect device on the right hand side of FIG. 1.

The circuit of FIG. 3 assumes that the reverse leakage through the polycrystalline silicon diode string is sufficient to discharge the inherent gate-to-substrate capacitance of the field-effect device to permit this device to switch "off" more or less immediately after light from the control circuit emitting device is no longer impinging on the photodiode string. The leakage necessary will often be provided by polycrystalline silicon diodes as the semiconductor pn junctions in such diodes are usually of relatively inferior quality. If not, a resistance can be provided connected electrically in parallel across the photodiodes string to provide a discharge path.

While the field-effect devices shown in FIGS. 1 through 3 are p-channel devices, n-channel devices can also be controlled by reversing the polarity connections of the diode string from that shown in FIG. 3. Thus, there is no distinction between the use of n-channel and p-channel field-effect devices insofar as being amenable to being controlled by a series connected string of polycrystalline silicon photodiodes having the nature shown in FIGS. 1 and 2 of the present application.

The typical substrate used in FIGS. 1 and 2 has already been described. The silicon dioxide between polycrystalline silicon strip 12 and the major surface of substrate 10 is typically 8000 in thickness. The thickness of the polycrystalline silicon strip 12 is typically 3000. The silicon dioxide overlaying polycrystalline silicon strip 12 would be typically 8000 in thickness and, as such, is an overlying layer with a thickness sufficiently thin to permit the typical electromagnetic radiation provided in actuating the photodiodes in strip 12 to pass through this layer with relatively little attenuation. Thus, the polycrystalline silicon photodiodes may be sufficiently illuminated to operate but also be protected from other undesirable environmental influences. The p-type conductivity regions in polycrystalline silicon strip 12 are typically doped with boron to the extent of $10^{18}$ atoms/cm$^3$ while the n-type conductivity regions are typically doped with phosphorus to the extent of $10^{20}$ atoms/cm$^3$.

The embodiments of the invention in which an exclusive property or right is claimed are defined as follows:

1. A semiconductor device having therein a plurality of photodiodes connected in series, said device comprising:

a semiconductor material body having a major surface;

an insulating means disposed on said semiconductor material body major surface comprising at least a first layer of insulating material having a surface portion;

a first polycrystalline semiconductor material layer disposed on said first insulating material layer surface portion, said polycrystalline semiconductor material layer comprising a plurality of regions of a first conductivity type and a plurality of regions of a second conductivity type with members of said first and second pluralities of polycrystalline semiconductor material layer regions alternating in position with one another such that a member from either of said first and second pluralities of polycrystalline semiconductor material layer regions is immediately adjacent to at most a pair of members from the opposite plurality, except for two end members each of which are immediately adjacent to only one member from an opposite plurality, there being a semiconductor pn junction between those said polycrystalline semiconductor material layer regions which are immediately adjacent as aforesaid; and electrical shorting means between each said polycrystalline semiconductor material layer region and at most one of any said polycrystalline semiconductor material layer regions which are immediately adjacent as aforesaid.

2. The device of claim 1 wherein said semiconductor material body is of doped silicon and said polycrystalline semiconductor material layer is also of doped silicon.

3. The device of claim 1 wherein there is contained a first field-effect device, said first-effect device comprising:

said semiconductor material body being of a first conductivity type, in at least a first portion thereof serving as a first substrate therein, except in selected regions of said first substrate, with said first body portion intersecting said major surface in a first major surface portion, said first body portion having a first dopant distribution therein leading to said first conductivity type;

a first field-effect device channel region located at least in part in said first substrate;

a pair of first field-effect device terminating regions each being of a second conductivity type and each being located in one of said selected regions intersecting said first major surface portion such that they are separated by said first field-effect device channel region, there being a pn junction separating each member of said first field-effect device terminating region pair from remaining portions of said first substrate, said first field-effect device terminating region pair having a second dopant distributed in each member leading to said second conductivity type;

a first field-effect device control gate region separated from said first major surface portion by a second insulating material layer of a first thickness and located across said first insulating layer from said first field-effect device channel region;

a first field-effect device shield region separated from said first major surface by a third insulating material layer of a second thickness and located across said second insulating layer from substantially all of at least one of said terminating region member pn junctions where this said terminating region member pn junction intersects said first major surface portion.

4. The device of claim 2 wherein said insulating means comprises an oxide of silicon.

5. The device of claim 2 wherein said insulating means comprises a nitride of silicon.

6. The device of claim 3 wherein a selected one of said end members from one of said first and second pluralities of polycrystalline semiconductor material layer regions is electrically connected to said first field-effect device control gate region.

7. The device of claim 3 wherein a selected one of said end members from one of said first and second pluralities of polycrystalline semiconductor material layer regions is electrically connected to said first substrate.

8. The device of claim 6 wherein said selected end member and said first field-effect device control gate region are together joined to form a single connected structure with at least one common material used throughout said joined structure.

9. The device of claim 6 wherein said selected end member and said first field-effect device shield region are together joined to form a single connected structure with at least one common material used throughout said joined structure.

10. The device of claim 6 wherein said selected end member, said first field-effect device control gate region, and said first field-effect device shield region are together joined to form a single connected structure with at least one common material used throughout said joined structure.

11. The device of claim 7 wherein that remaining one of said end members from said first and second pluralities of polycrystalline semiconductor material layer regions is electrically connected to said first field-effect device control gate region.

12. The device of claim 8 wherein said first insulating material layer joins with said second and third insulating material layers in at least some locations.

13. The device of claim 9 wherein said first insulating material layer joins with said second and third insulating material layers in at least some locations.

14. The device of claim 10 wherein said first insulating material layer joins with said second and third insulating material layers in at least some locations.

* * * * *